United States Patent [19]

Moore

[11] 4,050,756

[45] Sept. 27, 1977

[54] CONDUCTIVE ELASTOMER CONNECTOR AND METHOD OF MAKING SAME

[75] Inventor: John R. Moore, Santa Ana, Calif.

[73] Assignee: International Telephone and Telegraph Corporation, New York, N.Y.

[21] Appl. No.: 642,686

[22] Filed: Dec. 22, 1975

[51] Int. Cl.² .......................... H01R 13/24; H05K 1/04

[52] U.S. Cl. .......................... 339/59 M; 29/628; 200/265; 338/114; 428/47; 428/119; 428/120; 428/133; 428/367; 428/372; 428/447; 428/474; 428/480; 428/901; 339/DIG. 3; 174/68.5

[58] Field of Search .......................... 200/265; 338/114; 428/47, 367, 372, 901, 119, 120, 474, 447, 133, 480; 339/59 M, 61 M, DIG. 3, 17 L, 17 LC, 17 LM, 17 M; 29/628; 174/68.5

[56] References Cited

U.S. PATENT DOCUMENTS

| | | | |
|---|---|---|---|
| 2,786,104 | 3/1957 | Kirchel | 200/265 |
| 2,889,532 | 6/1959 | Slack | 339/17 M |
| 3,235,830 | 2/1966 | Newton | 339/59 M |
| 3,251,018 | 5/1966 | Bennett | 339/61 M |
| 3,295,088 | 12/1966 | Smith | 338/114 |
| 3,354,543 | 11/1967 | Lawrence | 29/628 |
| 3,680,037 | 7/1972 | Nellis | 339/61 M |
| 3,835,442 | 9/1974 | Anderson | 339/DIG. 3 |
| Re. 28,595 | 10/1975 | DuRocher | 200/265 |

FOREIGN PATENT DOCUMENTS

| | | | |
|---|---|---|---|
| 1,070,926 | 6/1967 | United Kingdom | 339/59 M |

OTHER PUBLICATIONS

"Conductive Elastomeric Connector," Tecknit July 1974.

"Conductive Elastomeric LC Interconnector--CELCI", Tecknit, June 1974.

*Primary Examiner*—Ellis Robinson

*Attorney, Agent, or Firm*—Thomas L. Peterson

[57] ABSTRACT

An electrical connector in which conductive rubber rods are mounted in a nonconductive substrate. The rods extend above and below the upper and lower surfaces, respectively, of the substrate for electrically interconnecting conductive traces on a pair of electronic components, such as a display panel and logic circuit used in a digital wrist watch. A method for making the connector is disclosed.

2 Claims, 8 Drawing Figures

CONDUCTIVE ELASTOMER CONNECTOR AND METHOD OF MAKING SAME

BACKGROUND OF THE INVENTION

This invention relates generally to an electrical connector and, more particularly, to a conductive elastomer connector and to the method of making the same.

With the advent of micro displays being used in digital computers and wrist watches, the problem of interconnecting the display panels to the logic circuits has become acute because of the very small spaces involved in such applications. The use of conductive elastomer electrical connectors for interconnecting the display panels to the logic curcuits is well known in the art. Reference is made to U.S. Pat. No. 3,648,002 to DuRocher, which discloses a conductive elastomer connector in which conductive elastomer pads are mounted in openings in a nonconductive elastomer substrate. The upper and lower surfaces of the pads are flush with the upper and lower surfaces of the substrate. The pads are formed of a resiliently compressible, electrically nonconductive elastomer having discrete, electrically conductive particles dispersed therethrough. The particles may be carbon black or metal, such as gold or silver, or a combination of the same. The preferred elastomer is silicone rubber because of its long term stability and relatively low compression set. The conductive particles are responsive to compression of the pads to establish electrically conductive paths through the pads. As will be appreciated, since the surfaces of the pads are flush with the upper and lower surfaces of the nonconductive elastomer substrate, compression of the substrate is required in order to compress the pads and thus render them electrically conductive. This arrangement leads to the requirement of relatively high compression forces in order to provide electrical connection between the electronic devices being interconnected by the aforementioned conductive elastomer connector. Furthermore, such connector does not permit as high density pattern of electrical paths as is required for some applications. It is the purpose of the present invention to provide a conductive elastomer connector which does not require compression of the nonconductive substrate to render the conductor filled pads electrically conductive and will permit higher density packaging than the prior art connector described hereinbefore.

The term "conductive elastomer" utilized in this specification and the claims appended hereto is intended to mean a compressible nonconductive elastomer filled with conductive particles, which becomes electrically conductive when compressed as described hereinabove and disclosed in detail in the aforementioned DuRocher patent. The term "conductive elastomer" is also intended to include an elastomer sufficiently loaded with conductive particles that it is electrically conductive even without compression.

SUMMARY OF THE INVENTION

According to the principal aspect of the present invention, there is provided a conductive elastomer connector comprising a nonconductive substrate having a plurality of holes therethrough. In contrast to the aforementioned prior art conductive elastomer connector, the substrate of the present invention need not be compressible. Conductive elastomer rods are retained in the holes in the substrate. The rods extend above the upper surface and below the lower surface of the substrate so that only the rods need be engaged in order to provide an electrically conductive path through the connector.

According to another aspect of the invention, there is provided a novel method for making the aforementioned conductive elastomer connector in extremely small sizes with very close center-to-center spacing of the conductive elastomer rods, thus permitting very high density packaging. A plurality of openings are provided through a laminate consisting of an insulative substrate having metal layers on the top and bottom surfaces thereof. The openings are preferably formed by etching processes. The openings are then filled with a conductive elastomer. Thereafter, the metal layers are removed from the insulative substrte leaving conductive elastomer rods in the substrate which extend above and below the top and bottom surfaces thereof.

DESCRIPTION OF THE PREFERRED EMBODIMENTS

Figure 1:
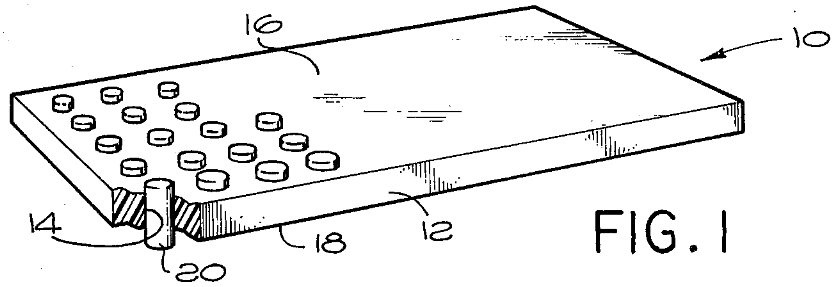
FIG. 1 is a perspective view of a conductive elastomer connector constructed in accordance with the present invention, with a portion of one corner thereof broken away to show how a conductive elastomer rod is mounted in the substrate of the connector.

Referring now to FIG. 1 of the drawings in detail, there is illustrated the electrical connector of the present invention, generally designated 10. The connector comprises a flat, electrically nonconductive substrate 12 having a plurality of openings 14 therethrough which extend from the upper surface 16 to the lower surface 18 of the substrate. Conductive elastomer rods 20 are mounted in the holes 14. The rods extend above the upper surface 16 and below the lower surface 18 of the substrate 12. Thus, only the conductive elastomer rods need be engaged (or compressed if compression is required to render the rods conductive) in order to provide electrical paths through substrate 12. As a consequence, the substrate 12 may be formed either of a compressible or noncompressible material. The substrate may be formed of a rigid material if used as a part of an alignment structure in an electrical interconnection arrangement. Alternatively, the substrate may be formed of a flexible or semi-flexible nonconductive material, and may be used as a compliant member in complex shape factors or where control of electrical contact by camber or thickness variations are necessary. By way of example only, the substrate material can be a cicruit stable material such as Kapton polymide, G-10 epoxy fiberglass board, or Mylar oriented polyester. The conductive elastomer rods 20 may be formed of any of the various materials described in the aforementioned DuRocher patent and otherwise well known in the art.

Figure 2:
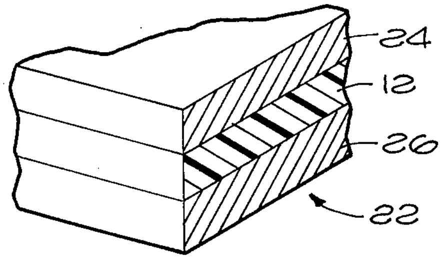
FIGS. 2 to 7 are fragmentary, perspective sectional view illustrating the various steps employed in practicing the method of the present invention.
Figure 3:
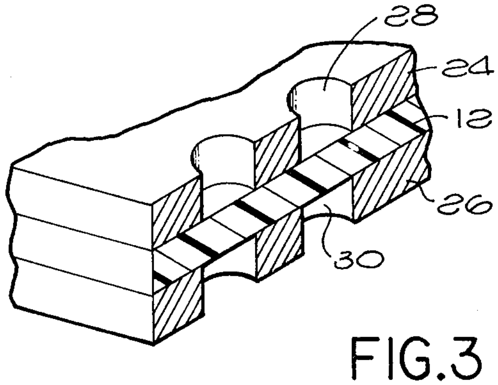
Figure 4:
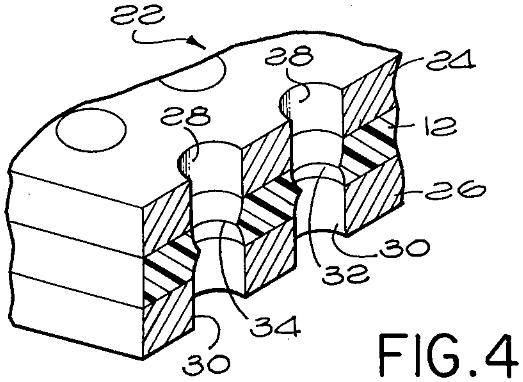

Reference is now made to FIGS. 2 to 7 of the drawings which illustrate the steps utilized in making the connector 10 of the present invention. Initially, there is provided a laminate 22 consisting of the electrically nonconductive substrate 12 with metal layers 24 and 26 bonded to the upper and lower surfaces of the substrate, as seen in FIG. 2. As seen in FIG. 3, aligned holes 28 and 30 are then formed in the metal layers 24 and 26, respectively, by etching using standard photo-resist techniques. The holes 28 and 30 are arranged in the desired electrical interconnection pattern applicable to the particular application for which the resulting connector will be utilized. Using the two-sided metal etched hole pattern as a template, the substrate 12 is then etched to provide holes 32 in the substrate aligned with the holes 28 and 30 in the metal layers, as seen in FIG. 4. The aligned holes 28, 32, and 30 thereby provide openings extending completely through the laminate 22, as seen in FIG. 4. By etching the substrate 12 to provide the holes 32, each hole has an underetch pattern providing an inwardly extending annular ridge 34.

Figure 5:
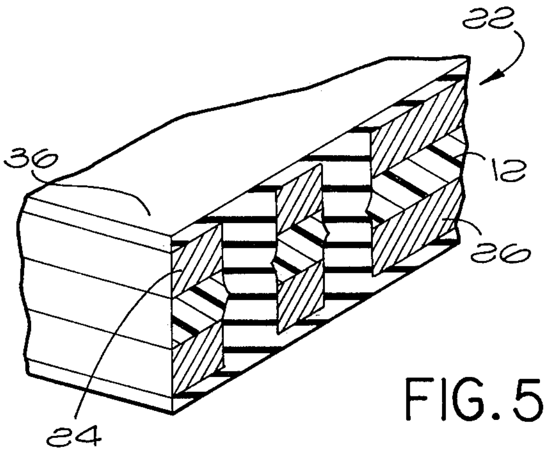
Figure 6:
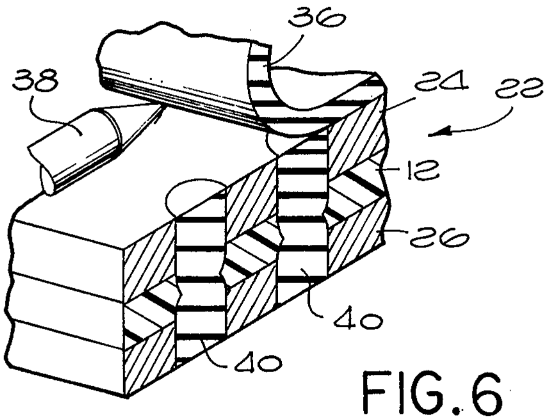
Figure 7:
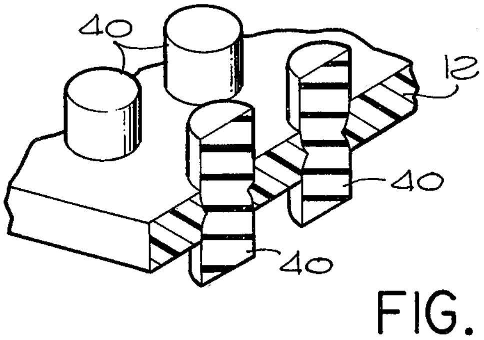

A layer 36 of conductive elastomer, preferably a conductor filled silicone rubber, is then placed on top of the laminate 22. The laminate with the conductive layer 36 is then compressed in a mold, causing some of the elastomer to be squeezed into and completely fill the openings in the laminate 22, as seen in FIG. 5. For silicone rubber, the mold is preferably heated to about 350° F. After the molding operation, the excess flash of the layer 36 is removed from the upper surface of the laminate 22 by the use of a suitable tool, as indicated at 38 in FIG. 6, thus leaving conductive elastomer rods 40 in the laminate extending from the upper surface thereof to the lower surface. The metal layers 24 and 26 are then etched away, leaving the conductive elastomer rods 40 formed in the desired pattern within the nonconductive substrate 12, as seen in FIG. 7.

It will be appreciated that the inwadly extending annular ridges 34 on the underetched holes 32 in the substrate 12 serve to retain the conductive elastomer rods 40 in the substrate. If desired, a suitable selective primer, such as silane or silizol, may be painted on the laminate illustrate in FIG. 4 to coat the openings therein to enhance the adhession of the conductive elastomer rods 40 to the walls of the holes 32 in the substrate 12.

Figure 8:
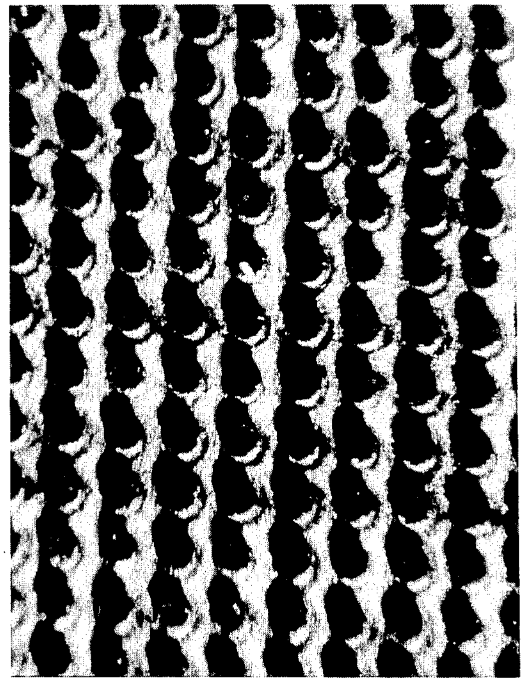
FIG. 8 is a photograph of the top of a small section of a connector constructed in accordance with the present invention, enlarged 50 times, showing the very high density pattern of the conductive rods in the connector substrate.

A connector as shown in fragmentary form in FIG. 8, has been manufactured in accordnce with the method of the present invention utilizing copper for the metal layers 24 and 26, a 0.003 inch Mylar substrate, and a silicone rubber conductive elastomer. The pattern of holes in the substrate was a series of straight rows of holes, as seen in FIG. 8. The connector had 15,625 conductive elastomer rods of 4–5 mils in diameter packaged into one square inch using 8 mil center-to-center spacing. Thus, it is seen that by the present invention, very high density packaging may be achieved. Further, the substrate may be etched in an infinite number of shapes and sizes to interconnect a large variety of electrical or electronic devices. Further, passive circuitry, such as resistors, conductors, compacitors, etc., can be added as part of the etched and formed substrate to complete any circuit or sub-circuit.

What is claimed is:

1. A conductive elastomer connector comprising:

a nonconductive planar substrate having generally parallel upper and lower surfaces;

a plurality of etched holes extending through said substrate from said upper surface to said lower surface;

a conductive elastomer rod retained in each of said holes, said rods extending above said upper surface and below said lower surface;

each said etched hole having an underetch pattern providing an inwardly extending annular ridge spaced from said upper and lower sufaces; and each said rod having an annular recess in its outer surface spaced from said upper and lower surfaces and receiving said annular ridge therein whereby said rods are retained in said holes by said ridges.

2. A conductive elastomer connector as set forth in claim 1 wherein:

said substrate and rods are formed of different materials.

* * * * *